(12) United States Patent
Fukuda et al.

(10) Patent No.: US 9,343,207 B2
(45) Date of Patent: May 17, 2016

(54) RESISTANCE CHANGE DEVICE, AND METHOD FOR PRODUCING SAME

(71) Applicants: Natsuki Fukuda, Shizuoka (JP); Kazunori Fukuju, Shizuoka (JP); Yutaka Nishioka, Shizuoka (JP); Koukou Suu, Shizuoka (JP)

(72) Inventors: Natsuki Fukuda, Shizuoka (JP); Kazunori Fukuju, Shizuoka (JP); Yutaka Nishioka, Shizuoka (JP); Koukou Suu, Shizuoka (JP)

(73) Assignee: Ulvac, Inc., Kanagawa (JP)

( * ) Notice: Subject to any disclaimer, the term of this patent is extended or adjusted under 35 U.S.C. 154(b) by 0 days.

(21) Appl. No.: 14/369,659

(22) PCT Filed: Aug. 27, 2013

(86) PCT No.: PCT/JP2013/005044
§ 371 (c)(1),
(2) Date: Jun. 27, 2014

(87) PCT Pub. No.: WO2014/038152
PCT Pub. Date: Mar. 13, 2014

(65) Prior Publication Data
US 2014/0361864 A1    Dec. 11, 2014

(30) Foreign Application Priority Data

Sep. 5, 2012    (JP) .................. 2012-194823

(51) Int. Cl.
*H01C 7/10*    (2006.01)
*H01C 7/108*    (2006.01)
(Continued)

(52) U.S. Cl.
CPC ............ *H01C 7/108* (2013.01); *C23C 14/0036* (2013.01); *C23C 14/08* (2013.01);
(Continued)

(58) Field of Classification Search
CPC ........ H01C 7/108; H01C 17/06; H01C 17/12; H01L 45/1625; H01L 45/08; H01L 45/1233; H01L 45/146
USPC ............................................................ 338/20
See application file for complete search history.

(56) References Cited

U.S. PATENT DOCUMENTS 6,682,772 B1 *    1/2004    Fox et al. ................... 427/79
2008/0026539 A1 *    1/2008    Kokaze et al. ............ 438/393
(Continued)

FOREIGN PATENT DOCUMENTS

JP         4643767 B2    3/2011
KR    1020120020989 A    3/2012
(Continued)

OTHER PUBLICATIONS

Office Action dated May 29, 2015 in Korean Application No. 10-2014-7009144.
(Continued)

*Primary Examiner* — Kyung Lee
(74) *Attorney, Agent, or Firm* — Saliwanchik, Lloyd & Eisenschenk

(57) ABSTRACT

To provide a resistance change device that can be protected from an excess current without enlarging a device size. A resistance change device 1 according to the present embodiment includes a lower electrode layer 3, an upper electrode layer 6, a first metal oxide layer 51, a second metal oxide layer 52, and a current limiting layer 4. The first metal oxide layer 51 is disposed between the lower electrode layer 3 and the upper electrode layer 6, and has a first resistivity. The second metal oxide layer 52 is disposed between the first metal oxide layer 51 and the upper electrode layer 6, and has a second resistivity higher than the first resistivity. The current limiting layer 4 is disposed between the lower electrode layer 3 and the first metal oxide layer 51, and has a third resistivity higher than the first resistivity and lower than the second resistivity.

10 Claims, 6 Drawing Sheets

(51) Int. Cl.
*H01L 45/00* (2006.01)
*C23C 14/00* (2006.01)
*C23C 14/08* (2006.01)
*H01C 17/06* (2006.01)
*H01C 17/12* (2006.01)

(52) U.S. Cl.
CPC ............... *H01C 17/06* (2013.01); *H01L 45/08* (2013.01); *H01L 45/12* (2013.01); *H01L 45/1233* (2013.01); *H01L 45/146* (2013.01); *H01L 45/1625* (2013.01); *H01C 17/12* (2013.01)

(56) References Cited

U.S. PATENT DOCUMENTS

| | | | |
|---|---|---|---|
| 2009/0283736 A1* | 11/2009 | Kanzawa et al. | 257/2 |
| 2010/0038791 A1 | 2/2010 | Lee et al. | |
| 2010/0207094 A1* | 8/2010 | Kanzawa et al. | 257/4 |
| 2011/0002154 A1* | 1/2011 | Mitani et al. | 365/148 |
| 2012/0049145 A1 | 3/2012 | Lee et al. | |
| 2012/0267598 A1* | 10/2012 | Sakotsubo et al. | 257/4 |
| 2012/0319071 A1* | 12/2012 | Awaya et al. | 257/4 |
| 2013/0119343 A1* | 5/2013 | Lee et al. | 257/4 |

FOREIGN PATENT DOCUMENTS

| | | |
|---|---|---|
| WO | WO-2009125777 A1 | 10/2009 |
| WO | WO-2010119671 A1 | 10/2010 |
| WO | WO-2012046454 A1 | 4/2012 |
| WO | WO-2012169195 A1 | 12/2012 |

OTHER PUBLICATIONS

International Search Report in International Application No. PCT/JP2013/005044, filed Aug. 27, 2013.

* cited by examiner

RESISTANCE CHANGE DEVICE, AND METHOD FOR PRODUCING SAME

CROSS-REFERENCE TO RELATED APPLICATIONS

The application is the U.S. national stage application of International Patent Application No. PCT/JP2003/005044, filed Aug. 27, 2013, which claims priority to Japanese Application No. 2012-194823, filed Sep. 5, 2012, the disclosures of each of which are incorporated herein by Reference in their entirety.

TECHNICAL FIELD

The present invention relates to a resistance change device used, for example, as a non-volatile memory, and a method of producing the same.

BACKGROUND ART

A semiconductor memory includes a volatile memory such as a DRAM (Dynamic Random Access Memory) and a non-volatile memory such as a flash memory. As the non-volatile memory, a NAND type flash memory is known. For more miniaturization, a resistance change device (ReRAM: Resistance RAM) draws the attention.

The resistance change device has a variable resistor where resistivity is changed reversibly depending on a voltage, and can store data in a non-volatile way corresponding to a high resistance state or a low resistance state. The resistance change device has features such as a high-speed operation and a low power consumption.

However, the resistance change device may generate an excess current upon a switching operation (a state transition from the high resistant state to the low resistant state), which may cause device breakage or may lower reliability of the device. In order to prevent this, there is a known technology that an external resistance is inserted to a switching circuit and the excess current is prevented from flowing to the device. For example, Patent Document 1 describes a resistance change non-volatile memory having a current limiting circuit including a diode.

Patent Document 1: Japanese Patent No. 4643767 (paragraph [0231], FIG. 21)

DISCLOSURE OF THE INVENTION

Problem to be Solved by the Invention

However, when the external resistance is placed on the switching circuit, a device size is undesirably enlarged. Also, an increase in a wiring length may undesirably generate a time loss to prolong a rewrite time upon the switching.

In view of the circumstances as described above, it is an object of the present invention to provide a resistance change device that can be protected from the excess current without enlarging the device size, and a method of producing the same.

Means For Solving The Problem

In order to achieve the above object, according to an embodiment of the present invention, there is provided a resistance change device including a first electrode, a second electrode, a first metal oxide layer, a second metal oxide layer, and a current limiting layer.

The first metal oxide layer is disposed between the first electrode and the second electrode, and has a first resistivity.

The second metal oxide layer is disposed between the first metal oxide layer and the second electrode, and has a second resistivity higher than the first resistivity.

The current limiting layer is disposed between the first electrode and the first metal oxide layer, and has a third resistivity higher than the first resistivity and lower than the second resistivity.

According to an embodiment of the present invention, there is provided a method of producing a resistance change device including forming a first electrode.

On the first electrode, a current limiting layer composed of a metal oxide is formed. The current limiting layer has a third resistivity higher than a first resistivity and lower than a second resistivity.

On the current limiting layer, a first metal oxide layer having the first resistivity is formed.

On the first metal oxide layer, a second metal oxide layer having the second resistivity is formed.

On the second metal oxide layer, a second electrode is formed.

BEST MODE(S) FOR CARRYING OUT THE INVENTION

Figure 1:
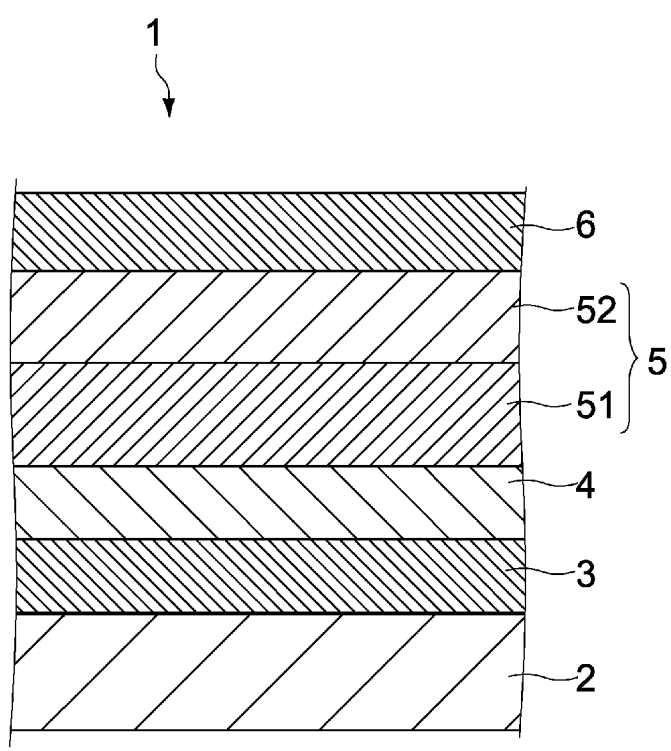
FIG. 1 A schematic cross-sectional side view showing a configuration of a resistance change device according to an embodiment of the present invention.

A resistance change device according to an embodiment of the present invention includes a first electrode, a second electrode, a first metal oxide layer, a second metal oxide layer, and a current limiting layer.

The first metal oxide layer is disposed between the first electrode and the second electrode, and has a first resistivity.

The second metal oxide layer is disposed between the first metal oxide layer and the second electrode, and has a second resistivity higher than the first resistivity.

The current limiting layer is disposed between the first electrode and the first metal oxide layer, and has a third resistivity higher than the first resistivity and lower than the second resistivity.

As the current limiting layer is disposed between the first electrode and the second electrode in the above-described resistance change device, the device can be protected from an excess current that may be generated upon a switching operation without enlarging a device size.

In addition, as the current limiting layer is disposed between the first electrode and the first metal oxide layer in the above-described resistance change device, reliability of the switching operation can be ensured as compared to the case that the current limiting layer is disposed between the second electrode and the second metal oxide layer.

The current limiting layer may be composed of a metal oxide.

In this way, the current limiting layer can be formed using the same film forming apparatus for forming the first and second metal oxide layers, thereby preventing the productivity from lowering.

A resistivity of the current limiting layer can be set depending on resistivities of the first and second metal oxide layers, a magnitude of a voltage applied between the first and the second electrodes or the like, as appropriate, and can be set such that the resistance change device 1 has the resistivity of 10 kΩ to 50 kΩ. In this way, the device can be effectively protected from an excess reset current that may be generated upon a switching operation from a high resistance state to a low resistance state.

The current limiting layer may be composed of a metal oxide including oxygen defects. In this way, an oxidation degree can be adjusted so that the current limiting layer having a desirable resistivity can be formed.

When the above-described current limiting layer is in an ohmic contact with the first electrode, a stable state transition between the high resistance state and the low resistance state, i.e., the switching operation, can be ensured.

The above-described first metal oxide layer may be composed of the metal oxide including the oxygen defects. In this case, the above-described second metal oxide layer may be composed of a metal oxide having a stoichiometric composition.

In this way, the first and second metal oxide layers having different resistivities can be formed easily.

A method of producing a resistance change device according to an embodiment of the present invention includes forming a first electrode.

On the first electrode, a current limiting layer composed of a metal oxide is formed. The current limiting layer has a third resistivity higher than a first resistivity and lower than a second resistivity.

On the current limiting layer, a first metal oxide layer having the first resistivity is formed.

On the first metal oxide layer, a second metal oxide layer having the second resistivity is formed.

On the second metal oxide layer, a second electrode is formed.

Hereinafter, embodiments according to the present invention will be described with reference to the drawings.

FIG. 1 is a schematic cross-sectional side view showing a configuration of a resistance change device according to an embodiment of the present invention.

A resistance change device 1 according to the present embodiment includes a substrate 2, a lower electrode layer 3 (a first electrode), a current limiting layer 4, an oxide semiconductor layer 5, and an upper electrode layer 6 (a second electrode).

The substrate 2 is composed of, for example, a silicon substrate, but may be composed of other substrate material such as a glass substrate.

The lower electrode layer 3 is disposed on the substrate 2, and is composed of platinum (Pt) in the present embodiment. The material is not limited thereto, and may be a transition metal including Hf, Zr, Ti, Al, Fe, Co, Mn, Sn, Zn, Cr, V, W or the like; or an alloy thereof (a silicon alloy such as TaSi, WSi and TiSi, a nitrogen compound such as TaN, WN, TiN and TiAlN, a carbon alloy such as TaC or the like).

The oxide semiconductor layer 5 has a first metal oxide layer 51 and a second metal oxide layer 52. The first metal oxide layer 51 and the second metal oxide layer 52 are composed of the same metal oxide material, but may be composed of different metal oxide materials.

One of the first metal oxide layer 51 and the second metal oxide layer 52 is composed of a metal oxide having a stoichiometric composition or a nearly stoichiometric composition (hereinafter referred to as "a stoichiometric composition material"). The other of the first metal oxide layer 51 and the second metal oxide layer 52 is composed of a metal oxide including a number of oxygen defects (hereinafter referred to as "an oxygen defect material"). In the present embodiment, the first metal oxide layer 51 is composed of the oxygen defect material, and the second metal oxide layer 52 is composed of the stoichiometric composition material. Thus, the second metal oxide layer 52 has the resistivity higher than that of the first metal oxide layer 51.

The first metal oxide layer 51 is disposed on the current limiting layer 4, and is composed of tantalum oxide (TaOx) in the present embodiment. The tantalum oxide of the first metal oxide layer 51 is formed of the oxygen defect material, and has the resistivity of from 1 Ω·cm to $1 \times 10^5$ Ω·cm. The first metal oxide layer 51 has a non-limiting thickness, is set to have a size to provide a desirable resistance value as appropriate, and is 40 nm, for example, in the present embodiment.

The material of the first metal oxide layer 51 is not limited to the above-described materials. For example, binary or ternary metal oxide materials including zirconium oxide (ZrOx), hafnium oxide (HfOx), titanium oxide (TiOx), aluminum oxide (AlOx), silicon oxide (SiOx), iron oxide (FeOx), nickel oxide (NiOx), cobalt oxide (CoOx), manganese oxide (MnOx), tin oxide (SnOx), zinc oxide (ZnOx), vanadium oxide (VOx), tungsten oxide (WOx), copper sulfate (CuOx), $Pr(Ca, Mn)O_3$, $LaAlO_3$, $SrTiO_3$, $La(Sr, Mn)O_3$ may be used.

The second metal oxide layer 52 is disposed on the first metal oxide layer 51, and is composed of tantalum oxide (TaOx) in the present embodiment. The tantalum oxide of the second metal oxide layer 52 is formed of the stoichiometric composition material, and has the resistivity higher than that of the first metal oxide layer 51. The value thereof is higher than $3 \times 10^6$ Ω·cm, higher than $3 \times 10^6$ Ω19 cm, but desirably not more than $3 \times 10^{11}$ Ω·cm.

The second metal oxide layer 52 has a non-limiting thickness, is set to have a size to provide a desirable resistance value as appropriate, and is 40 nm, for example, in the present embodiment. The material of the second metal oxide layer 52 is not limited to the above-described materials. For example, the above-described binary or ternary metal oxide materials are applicable.

The current limiting layer 4 is disposed between the lower electrode layer 3 and the metal oxide layer 51, and is composed of tantalum oxide (TaOx) in the present embodiment. The current limiting layer 4 has the resistivity (the third resistivity) higher than the resistivity (the first resistivity) of the first metal oxide layer 51 and lower than the resistivity (the second resistivity) of the second metal oxide layer 52.

The tantalum oxide of the current limiting layer 4 is formed of the oxygen defect material, and has the resistivity of, for example, from $1 \times 10^5$ Ω·cm to $3 \times 10^6$ Ω·cm, more desirably from $3 \times 10^5$ Ω·cm to $3 \times 10^6$ Ω·cm. The current limiting layer 4 has a non-limiting thickness, is set to have a size to provide a desirable resistance value as appropriate, and is 5 nm, for example, in the present embodiment.

Desirably, the current limiting layer 4 is in an ohmic contact with the lower electrode layer 3. In this way, a potential barrier between the current limiting layer 4 and the lower electrode layer 3 can be lowered, which allows the resistance change device 1 to be driven at a low voltage. In addition, the stable state transition between the high resistance state and the low resistance state, i.e., the switching operation, can be ensured.

The ohmic contact is created, for example, by the following methods:
(1) A metal oxide layer is formed by a high frequency sputtering method using a metal oxide target and an inert gas such as Ar.
(2) A metal oxide multilayer is laminated on an oxidative resistant electrode such as Pt, Ir, Ru Pd, TiN, TiAlN and TaN by an ALD method, a CVD method or a reactive sputtering method with an oxidizing gas.
(3) A metal oxide is deposited on an oxide electrical conductor such as IrOx, RuOx, $SrRuO_3$, $LaNiO_3$ and ITO by an ALD method, a CVD method or a reactive sputtering method with an oxidizing gas.
(4) A metal oxide is deposited on an oxide electrical conductor such as TaC, WSi and WGe including elements such as Si, C, Ge each having a high reducing power by an ALD method, a CVD method or a reactive sputtering method with an oxidizing gas.
(5) A metal material and an oxide material that form no potential barrier are combined.

The current limiting layer 4 is set to have the resistivity such that the resistance change device 1 has the resistivity of 10 kΩ to 50 kΩ. In this way, the device can be effectively protected from an excess reset current that may be generated upon a switching operation from a high resistance state to a low resistance state.

The upper electrode layer 6 is disposed on the second metal oxide layer 52, and is composed of platinum (Pt) in the present embodiment. The material is not limited thereto, and may be a transition metal including Hf, Zr, Ti, Al, Fe, Co, Mn, Sn, Zn, Cr, V, W or the like; or an alloy thereof (a silicon alloy such as TaSi, WSi and TiSi, a nitrogen compound such as TaN, WN, TiN and TiAlN, a carbon alloy such as TaC or the like).

The current limiting layer 4, the first metal oxide layer 51 and the second metal oxide layer 52 are formed by a reactive sputtering method using argon (Ar) and oxygen ($O_2$) as a process gas. The sputtering method is not especially limited, and a high frequency sputtering method, a DC sputtering method or the like can be applied, for example. In the present embodiment, the current limiting layer 4 composed of tantalum oxide, the metal oxide layers 51 and 52 are sequentially formed on the substrate (the current limiting layer 4) by a DC pulse sputtering method using a metal (Ta) target in a vacuum chamber into which oxygen is introduced. An oxidation degree of each of the current limiting layer 4 and the metal oxide layers 51 and 52 is controlled by an oxygen flow rate (partial pressure) introduced into the vacuum chamber.

In the resistance change device 1, as the second metal oxide layer 52 has the oxidation degree higher than that of the first metal oxide layer 51, the second metal oxide layer 52 has the resistivity higher than that of the first metal oxide layer 51. When a negative pressure is applied to the upper electrode layer 6 and a positive pressure is applied to the lower electrode layer 3, oxygen ions ($O^{2-}$) in the second metal oxide layer 52 that is high resistance are diffused into the first metal oxide layer 51 that is low resistance, thereby lowering the resistance of the second metal oxide layer 52 (the low resistance state). On the other hand, when a negative pressure is applied to the lower electrode layer 3 and a positive pressure is applied to the upper electrode layer 6, oxygen ions are diffused from the first metal oxide layer 51 to the second metal oxide layer 52, the second metal oxide layer 52 has again the high oxidation degree and has the high resistance (the high resistance state).

As described above, by controlling the voltage between the lower electrode layer 3 and the upper electrode layer 6, the second metal oxide layer 52 is reversibly switched from the high resistance state to the low resistance state. In addition, even if no voltage is applied between the electrode layers 3 and 6, the low resistance state and the high resistance state are held. Thus, data is written under the high resistance state and is read-out under the low resistance state such that the resistance change device 1 is available as a non-volatile memory device.

Figure 2:
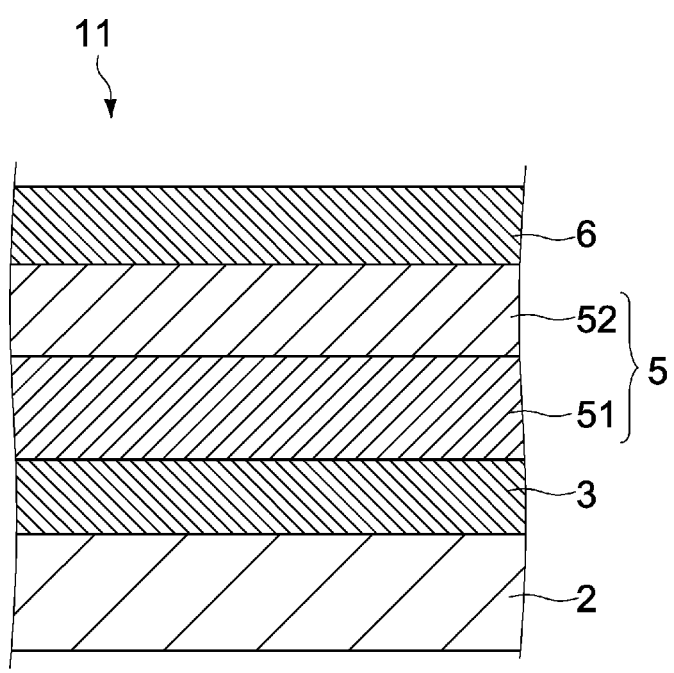
FIG. 2 A schematic cross-sectional side view showing a resistance change device according to a first comparative embodiment.

On the other hand, in a resistance change device generally shown in FIG. 2, the excess current may be temporarily generated upon the switching operation (for example, a transition from the high resistant state to the low resistant state). At this time, the device may be broken by the excess current, or may have decreased reliability (for example, a repetitive rewriting resistance).

FIG. 2 is a schematic cross-sectional side view showing a resistance change device 11 according to a first comparative embodiment that has a structure where the lower electrode layer 3, the first metal oxide layer 51, the second metal oxide layer 52 and the upper electrode layer 6 are laminated in this order on the substrate 2. The switching property of the resistance change device 11 according to the first comparative embodiment was evaluated. As a result, a current-voltage property shown in FIG. 3(A) was provided. In FIG. 2, the components corresponding to those in FIG. 1 are denoted by the same reference numerals, and the description thereof will be omitted. A contact area of each layer 3, 5 and 6 was 100 $\mu m^2$.

Figure 3:
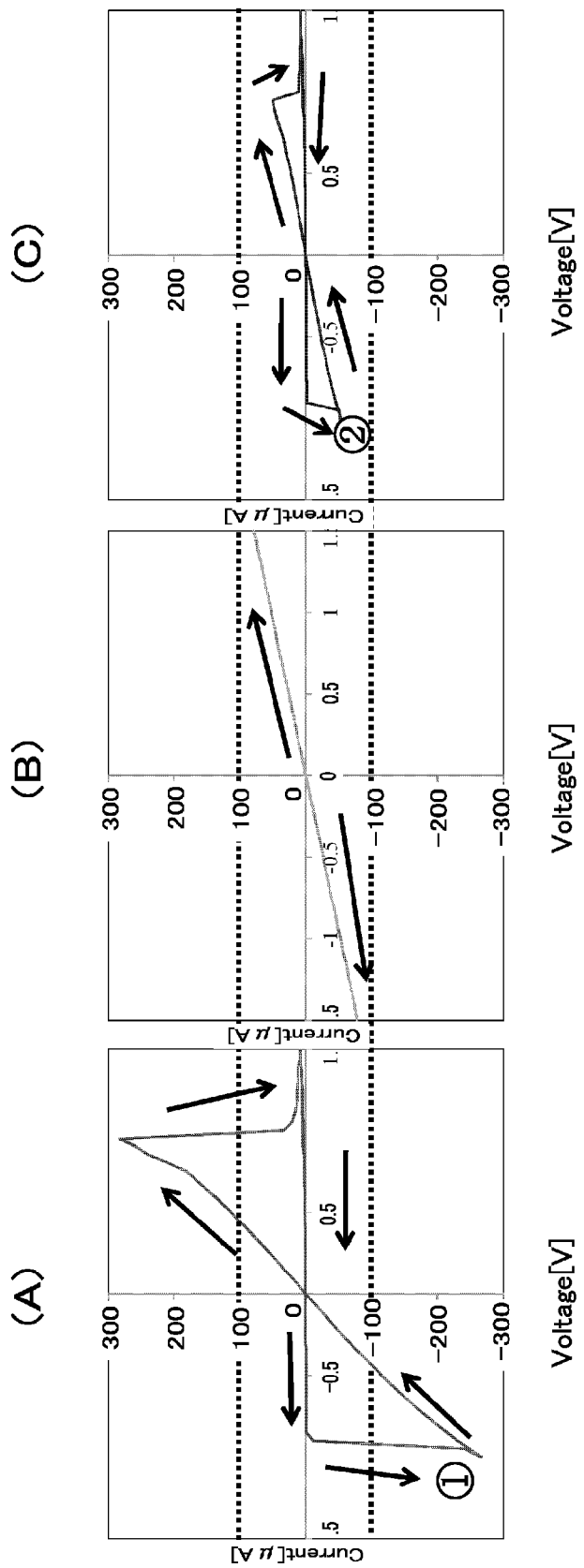
FIG. 3 (A) is an experimental result showing a switching property of the resistance change device according to the first comparative embodiment, (B) is an experimental result showing a current-voltage property of the current limiting layer used in the embodiment of the present invention, and (C) is an experimental result showing a switching property of the resistance change device including the current limiting layer.

As shown in FIG. 3(A), when about −1V of a voltage is applied to the resistance change device 11 upon writing data, the state of the resistance change device 11 is changed from the high resistance state to the low resistance state. On the other hand, when the voltage having a reverse polarity from that upon writing data is applied upon removing data, the resistance change device 11 is changed from the low resistance state to the high resistance state.

In the above-described comparative embodiment, regardless of a faint current flowing through the device under the high resistance state upon writing data, the excess reset current exceeding 100 μA (the absolute value) will flow through the device at the same time as the state is changed to the low resistance state. Although the magnitude of the reset current is changed depending on the resistivities of the metal oxide layers 51 and 52, some of the device designs may result in a too high current value to cause a breakage of the device or adversely affect a repetitive writing resistance.

Figure 4:
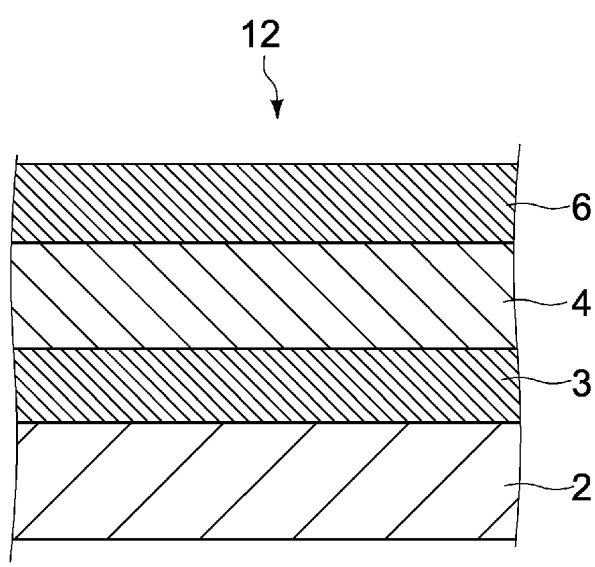
FIG. 4 A sample configuration view used for an evaluation of the current-voltage property of the current limiting layer.

According to the resistance change device 1 according to the present embodiment, the current limiting layer 4 having the above-described configuration is disposed between the lower electrode layer 3 and the upper electrode layer 6, thereby protecting the device from the excess current. FIG. 3(B) shows a current-voltage property of the current limiting layer 4. FIG. 4 is a sample configuration view used for the evaluation, and the components in FIG. 4 corresponding to those in FIG. 1 are denoted by the same reference numerals. A TaOx layer having about $3 \times 10^6$ Ω·cm was formed at a thickness of 5 nm by an oxygen reactive sputtering method using a Ta target such that each contact surface on upper and lower Pt electrode layers 3 and 6 was 100 μm².

From FIG. 3(B), the current limiting layer 4 had the resistance value of 19 kΩ at reading out voltage (1V). When the voltage was applied within a range of −1.5V to 1.5V, the current value was about 100 μA at most.

FIG. 3(C) shows a switching property of the resistance change device 1 shown in FIG. 1 according to the present embodiment produced using the current limiting layer 4 having the current-voltage property shown in FIG. 3(B). Each contact surface on each layer 3, 4, 5 or 6 was 100 μm². As a result, when about −1V of the voltage was applied, the reset current upon was about 52 μA at most.

As described above, as the current limiting layer 4 becomes a resistance component against the reset current in the present embodiment, the resistance change device 1 is protected from the excess current. In this way, the device can be protected from breaking by the excess current, or from lowering the repetitive rewriting resistance.

According to the present embodiment, as the current limiting layer 4 is incorporated within the device, the wiring length can be shorten as compared to the case that the current limiting circuit is disposed outside of the device, thereby preventing prolongation of a time to rewrite upon the switching. In addition, the device can be protected from the excess current that may be generated upon the switching operation without enlarging the device size.

Further, according to the present embodiment, the current limiting layer 4 is disposed between the lower electrode layer 3 and the low resistant first metal oxide layer 51. As compared to the case that the current limiting circuit is disposed between the upper electrode layer 6 and the high resistant second metal oxide layer 52, the reliability of the switching operation can be ensured as describe below.

Figure 5:
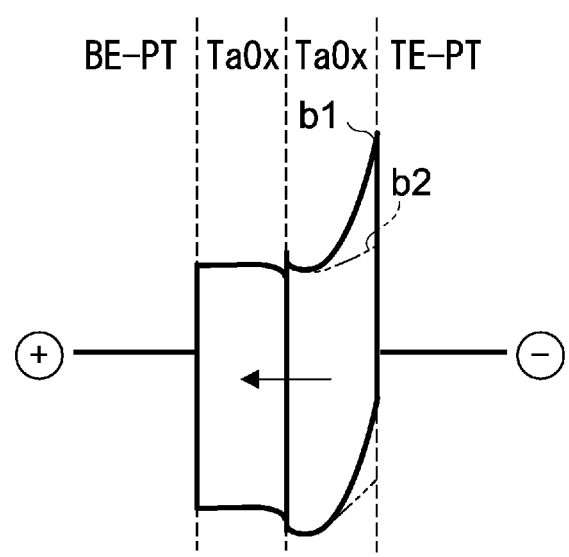
FIG. 5 A schematic view showing a potential property between the layers in the resistance change device according to the first comparative embodiment.
Figure 6:
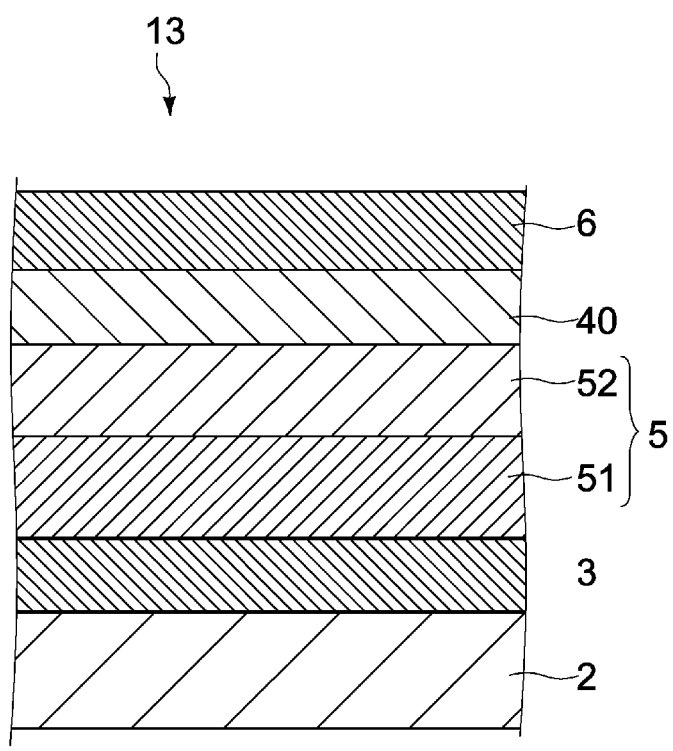
FIG. 6 A schematic cross-sectional side view showing a resistance change device according to a second comparative embodiment.

FIG. 5 is a schematic view showing a potential property between the layers in the resistance change device 11 according to the first comparative embodiment shown in FIG. 2. FIG. 6 shows a resistance change device 13 according to a second comparative embodiment that has a structure where the lower electrode layer 3, the first metal oxide layer 51, the second metal oxide layer 52, a current limiting layer 40 and the upper electrode layer 6 are laminated in this order on the substrate 2. In FIG. 5, the components corresponding to those in FIG. 1 are denoted by the same reference numerals. As the current limiting layer 40 has the same configuration as that of the current limiting layer 4 shown in FIG. 1, the description thereof will be omitted.

When the resistance change device 11 is in the high resistance state, a Schottky barrier on an interface between the upper electrode layer 6 (Te—Pt) and the second metal oxide layer 52 (TaOx) is high shown by a symbol b1 in FIG. 5. Thus, the resistance change device 11 shows a high resistance value. On the other hand, when the current limiting layer 40 is inserted between the upper electrode layer 6 and the second metal oxide layer 52 in an ohmic contact as shown in FIG. 6, the Schottky barrier is lowered shown by a symbol b2 in FIG. 5. In this case, in the resistance change device 13 shown in FIG. 6, the resistance value under the high resistance state is decreased, thereby being difficult to maintain the stable high resistance state.

Also, in the resistance change device 13 shown in FIG. 6, when a negative pressure is applied to the upper electrode layer 6 for writing data, oxygen ions in the current limiting layer 40 and the second metal oxide layer 52 are migrated into the first metal oxide layer 51. In this case, as there is the current limiting layer 40, an amount of oxygen ions needed for changing the resistance is increased, and the resistance will not change if a high voltage is not applied. Conversely, when a positive pressure is applied to the upper electrode layer 6 for removing data, oxygen ions in the second metal oxide layer 52 are undesirably migrated into the current limiting layer 40, and an excess operation is induced, which is not induced upon a normal switching operation, resulting in a decreased switching reliability.

In contrast, in the resistance change device 1 according to the present embodiment, as the current limiting layer 4 is inserted between the lower electrode layer 3 (BE-Pt) and the first metal oxide layer 51 (TaOx), a high potential barrier is ensured between the upper electrode layer 6 and the second metal oxide layer 52. In this way, the high resistance state can be stably maintained and a high reliability of the switching operation can be ensured.

While the present invention is described herein with reference to illustrative embodiments, it should be understood that the invention is not limited thereto. It should be appreciated that variations and modifications may be made without departing from the spirit of the present invention.

For example, although the current limiting layer 4 is composed of the metal oxide layer in the above-described embodiments, the current limiting layer 4 may be composed of other materials, e.g., of an oxidized film of the lower electrode layer 3. In this way, the function/effects similar to those in the above-described first embodiment can be provided.

In the above-described embodiments, although the second metal oxide layer 52 having the resistivity higher than that of the first metal oxide layer 51 is adhered to the upper electrode layer 6, the second metal oxide layer 52 may be adhered to the lower electrode layer 3 instead of the upper electrode layer 6. In this case, the current limiting layer 4 is disposed between the first metal oxide layer 51 and the upper electrode layer 6.

1 resistance change device
2 substrate
3 lower electrode layer
4 current limiting layer
5 oxide semiconductor layer
6 upper electrode layer
51 first metal oxide layer
52 second metal oxide layer

The invention claimed is:
1. A resistance change device, comprising:
 a first electrode;
 a second electrode;
 a first metal oxide layer having a first resistivity and being disposed between the first electrode and the second electrode;
 a second metal oxide layer having a second resistivity higher than the first resistivity and being disposed between the first metal oxide layer and the second electrode; and
 a current limiting layer having a third resistivity higher than the first resistivity and lower than the second resistivity and being disposed between the first electrode and the first metal oxide layer, the third resistivity being higher than $1 \times 10^5$ Ω·cm and not higher than $3 \times 10^6$ Ω·cm.

2. The resistance change device according to claim 1, wherein the current limiting layer is composed of a metal oxide.

3. The resistance change device according to claim 2, wherein the current limiting layer is composed of a metal oxide including an oxygen defect, and is in an ohmic contact with the first electrode.

4. The resistance change device according to claim 3, wherein
the first metal oxide layer is composed of a metal oxide including an oxygen defect, and
the second metal oxide layer is composed of a metal oxide having a stoichiometric composition.

5. The resistance change device according to claim 2, wherein
the first metal oxide layer is composed of a metal oxide including an oxygen defect, and
the second metal oxide layer is composed of a metal oxide having a stoichiometric composition.

6. The resistance change device according to claim 1, wherein
the current limiting layer is composed of a metal oxide including an oxygen defect, and is in an ohmic contact with the first electrode.

7. The resistance change device according to claim 6, wherein
the first metal oxide layer is composed of a metal oxide including an oxygen defect, and
the second metal oxide layer is composed of a metal oxide having a stoichiometric composition.

8. The resistance change device according to claim 1, wherein
the first metal oxide layer is composed of a metal oxide including an oxygen defect, and
the second metal oxide layer is composed of a metal oxide having a stoichiometric composition.

9. A method of producing a resistance change device, comprising:
forming a first electrode;
forming, by a reactive sputtering method, a current limiting layer composed of a metal oxide having a third resistivity higher than a first resistivity and lower than a second resistivity on the first electrode, the third resistivity being higher than $1\times10^5$ $\Omega\cdot$cm and not higher than $3\times10^6$ $\Omega\cdot$cm;
forming a first metal oxide layer having the first resistivity on the current limiting layer;
forming a second metal oxide layer having the second resistivity on the first metal oxide layer; and
forming a second electrode on the second metal oxide layer.

10. The method according to claim 9, wherein the first metal oxide layer and the second metal oxide layer are formed by a reactive sputtering method under oxygen atmosphere.

* * * * *